United States Patent
Reboud et al.

(10) Patent No.: US 10,739,583 B2
(45) Date of Patent: Aug. 11, 2020

(54) METHOD FOR OBTAINING AT LEAST ONE STRUCTURE APPROXIMATING A SOUGHT STRUCTURE BY REFLOW

(71) Applicant: COMMISSARIAT A L'ENERGIE ATOMIQUE ET AUX ENERGIES ALTERNATIVES, Paris (FR)

(72) Inventors: Vincent Reboud, Paris (FR); Stefan Landis, Tullins (FR); Etienne Rognin, Le Havre (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 526 days.

(21) Appl. No.: 15/112,375

(22) PCT Filed: Jan. 19, 2015

(86) PCT No.: PCT/EP2015/050906
§ 371 (c)(1),
(2) Date: Jul. 18, 2016

(87) PCT Pub. No.: WO2015/107202
PCT Pub. Date: Jul. 23, 2015

(65) Prior Publication Data
US 2016/0334620 A1 Nov. 17, 2016

(30) Foreign Application Priority Data

Jan. 20, 2014 (FR) ...................................... 14 50410

(51) Int. Cl.
*B29C 35/00* (2006.01)
*G02B 27/00* (2006.01)
(Continued)

(52) U.S. Cl.
CPC ........ *G02B 27/0012* (2013.01); *B29C 35/002* (2013.01); *B29C 35/02* (2013.01);
(Continued)

(58) Field of Classification Search
CPC ..................................................... G02B 3/0018
See application file for complete search history.

(56) References Cited

U.S. PATENT DOCUMENTS

2003/0015660 A1  1/2003  Shishido et al.
2012/0095705 A1  4/2012  Landis et al.

FOREIGN PATENT DOCUMENTS

EP    1 531 346 A1    5/2005
JP    7-287388 A     10/1995
(Continued)

OTHER PUBLICATIONS

H, Ottevaere, et al., "Comparing glass and plastic refractive microlenses fabricated with different technologies", Journal of Optics A: Pure and Applied Optics 8, Issue 7, 2006, (23 pages).
(Continued)

*Primary Examiner* — Ryan M Ochylski
(74) *Attorney, Agent, or Firm* — Oblon, McClelland, Maier & Neustadt, L.L.P.

(57) ABSTRACT

A method for determining at least one reflow parameter for obtaining a structure approximating a sought structure by reflowing an initial structure different to the sought structure, the initial structure including at least one pattern formed in a thermo-deformable layer arranged on a substrate. The thermo-deformable layer forms a residual layer surrounding each pattern and from which each pattern extends such that each pattern has an interface only with the surrounding medium. The method includes: predicting progression over time of geometry of the initial structure subject to reflow, to obtain a plurality of predicted structures each associated
(Continued)

with reflow parameters including at least a reflow time and a reflow temperature; computing correlation values of the geometry of each predicted structure with respect to the sought structure; identifying reflow parameters for obtaining the predicted structure offering a highest correlation value.

21 Claims, 9 Drawing Sheets

(51) Int. Cl.
| | |
|---|---|
| B81C 1/00 | (2006.01) |
| B29C 35/02 | (2006.01) |
| B29C 59/02 | (2006.01) |
| B29D 11/00 | (2006.01) |
| G02B 3/00 | (2006.01) |
| G02B 3/02 | (2006.01) |
| G02B 3/08 | (2006.01) |
| B29K 25/00 | (2006.01) |
| B29K 33/00 | (2006.01) |
| B29L 11/00 | (2006.01) |

(52) U.S. Cl.
CPC ........ *B29C 59/02* (2013.01); *B29D 11/00269* (2013.01); *B29D 11/00365* (2013.01); *B81C 1/00103* (2013.01); *G02B 3/0018* (2013.01); *G02B 3/02* (2013.01); *G02B 3/08* (2013.01); *B29K 2025/06* (2013.01); *B29K 2033/12* (2013.01); *B29L 2011/005* (2013.01); *B81B 2201/047* (2013.01); *B81B 2203/0392* (2013.01)

(56) References Cited

FOREIGN PATENT DOCUMENTS

| JP | 2003-173948 A | 6/2003 |
|---|---|---|
| JP | 2005-148427 A | 6/2005 |
| JP | 2006-235084 A | 9/2006 |
| JP | 2013-539067 A | 10/2013 |
| WO | 2011/138237 A1 | 11/2011 |

OTHER PUBLICATIONS

Yung-Chun Lee, et al., "Spherical and Aspheric Microlenses Fabricated by Excimer Laser LIGA-like Process", Journal of Manufacturing Science and Engineering, vol. 129, Issue 1, Jun. 26, 2006 (1 page).

Jerome Vaillant, et al., "Uniform illumination and rigorous electromagnetic simulations applied to CMOS image sensors", Optics Express, vol. 15, No. 9, Apr. 30, 2007, (10 pages).

Helmut Schift, et al., "Shape control of polymer reflow structures fabricated by nanoimprint lithography", Elsevier, Microelectronic Engineering 88, 2011, (6 pages).

Ronald L. Jones, et al., "Real-Time Shape Evolution of Nanoimprinted Polymer Structures during Thermal Annealing", Nano Letters, vol. 6, No. 8, 2006, (6 pages).

Yang Chen, et al., "A reflow process for glass microlens array fabrication by use of precision compression molding", Journal of Micromechanics and Microengineering, vol. 18, No. 5, Apr. 8, 2008, (3 pages).

S, Landis, et al., "Quantitative characterizations of a nanopatterned bonded wafer: force determination for nanoimprint lithography stamp removal", Nanotechnology, vol. 19, No. 12, Feb. 20, 2008, (2 pages).

J. C. Galas, et al., "Fabrication of three-dimensional microstructures using standard ultraviolet and electron-beam lithography", Journal of Vacuum Science and Technology B 22, 2004, (1 page), http://scitation.aip.org/content/avs/journal/jvstb/22/3/10.1116/1.1755213.

Takahiko Morita, et al., "Free-space-wiring fabrication in nano-space by focused-ion-beam chemical vapor deposition" Journal of Vacuum Science and Technology B 21, 2003, (1 page), http://scitation.aip.org/content/avs/journal/jvstb/21/6/10.1116/1.1630329.

W. H. Teh, et al., "Effect of low numerical-aperture femtosecond two-photon absorption on (SU-8) resist for ultrahigh-aspect ratio microstereolithography", Journal of Applied Physics 97, 2005, (12 pages).

Gerard M. Schmid, et al., "Implementation of an imprint damascene process for interconnect fabrication", Journal of Vacuum Science and Technology B, 24(3), 2006, (9 pages).

S. Grilli, et al., "Micro-optical foundry: 3D lithography by freezing liquid instabilities at nanoscale", SPIE Proceedings, Fabrication and Packaging of Micro-Optical Components, vol. 8428, 2012, (1 page).

Arne Schleunitz, et al., "Fabrication of 3D nanoimprint stamps with continuous reliefs using dose-modulated electron beam lithography and thermal reflow", Journal of Micromechanics and Microengineering, vol. 20, No. 9, Aug. 5, 2010, (2 pages).

Etienne Rognin, et al., "Characterization and applications of flowing nanoimprinted thin polymer films", Thesis, Feb. 4, 2013, (32 pages).

Sung-Kil Lee, et al., "Glass Reflowed Microlens Array and its Optical Characteristics", Optical Mems and Nanophotonics, Aug. 1, 2007, XP031155575, (2 pages).

International Search Report dated Apr. 17, 2015 for PCT/EP2015/050906 filed on Jan. 19, 2015.

PRIOR ART

METHOD FOR OBTAINING AT LEAST ONE STRUCTURE APPROXIMATING A SOUGHT STRUCTURE BY REFLOW

TECHNICAL FIELD OF THE INVENTION

The present invention relates to a method for obtaining three-dimensional patterns of micrometric or nanometric size having complex profiles. It relates more particularly to the simultaneous creation, on a wafer, of arrays of patterns having complex profiles. It has the advantageous, but not limiting, application of the formation of optical lenses of micrometric or nanometric size and notably of aspheric optical lenses.

PRIOR ART

In order to obtain patterns having complex profiles, a first known solution consists of approximating any complex profile by a profile formed by a multitude of steps, i.e. formed by a stack of discrete volumes. The techniques usually used require either a plurality of successive lithography steps or long, complex and costly sequential lithography techniques. Moreover, in practice, the number of the levels of height that can be produced remains limited, typically some tens of levels for the most complex shapes.

It has also been known since the 1980s to reflow, i.e. partially melt, patterns previously obtained using conventional lithography techniques (ultraviolet or e-beam electron beam lithographies) in order to produce three-dimensional patterns in a single reflow operation at wafer-scale.

By way of example, optical microlens arrays have been obtained in a single reflow operation of a resin layer wherein patterns having a simple shape, typically contacts of rectangular cross-section arranged on a substrate, were previously formed by UV lithography. This type of method was for example proposed in 1988 by Z. D. Popovic and coauthors in an article published in "Applied Optics", No. 27, pages 1281-1284, entitled "Technique for monolithic fabrication of microlens arrays" (1988).

However, this type of method is not suitable for obtaining any arbitrary complex shape after reflow. For example, while it is known how to obtain microlens arrays of hemispherical shape, obtaining aspherical microlens arrays wherein the optical properties are well superior is not feasible merely using this technique. For example, spherical lenses, unlike aspherical lenses, induce optical aberrations as the rays passing through the centre of the lens do not converge at exactly the same point as those passing through the edges, which causes blurring at wide apertures and an enlargement of the beam spot.

In order to enhance the approximation of the ideal shape sought, it is known to use, inter alia, laser exposure or laser ablation techniques. In this case, the method is always very long as the fabrication of the shapes must be performed individually on each pattern.

Moreover, it has been proposed to expose with a plurality of UV or e-beam lithography steps shapes having initially more than two levels in order to obtain, after reflow, a final shape best approximating the final shape sought. However, it is not currently possible to predict, on the basis of the final shape sought, the initial shape to undergo reflow due to the complexity of the mechanisms involved during reflow. Similarly, starting with a given initial shape, it is likewise not possible to accurately predict the final shape that will be obtained after reflow of this initial shape. It is thus necessary to conduct numerous tests which represents a frequently prohibitive cost essentially due to the cost of production of the masks and the molds.

There is thus a need consisting of proposing a solution for obtaining complex three-dimensional shapes closer to the ideal shapes sought while retaining a limited cost.

The other aims, features and advantages of the present invention will emerge on examining the following description and the accompanying drawings. It is understood that further advantages may be incorporated.

SUMMARY OF THE INVENTION

According to one embodiment, the invention relates to a method for determining at least one reflow parameter for obtaining a structure approximating a sought structure by means of reflow of an initial structure different to the sought structure. The initial structure consists of at least one pattern formed in a thermo-deformable layer arranged on a substrate. The thermo-deformable layer forms a residual layer surrounding each pattern and from which each pattern extends such that each pattern has an interface only with the surrounding medium. The method comprises at least the following steps implemented by at least one microprocessor:
  a step for predicting the progression over time of the geometry of the initial structure subject to reflow, so as to obtain a plurality of geometries of predicted structures each associated with reflow parameters comprising at least a reflow time and a reflow temperature;
  a step for computing correlation values of the geometry of each predicted structure with respect to the sought structure;
  a step for identifying reflow parameters for obtaining the predicted structure offering the highest correlation value.

As such, the invention makes it possible to accurately determine the parameters for obtaining by means of reflow shapes with arbitrary and possibly complex profiles, notably due to the presence of a residual layer at the base of each of the patterns of the initial structure and controlling deterministically the profile of the initial patterns and/or the thermal annealing conditions in order to obtain a very good approximation of the sought structure.

The identified reflow parameters are intended to be applied in a step for reflow of the initial structure.

As such, the invention makes it possible to address each of the following problems:
  based on a given initial structure, the invention makes it possible to determine the optimal reflow conditions for obtaining the final structure closest to the sought structure;
  by setting reflow conditions (typically reflow temperature and time), the invention makes it possible to determine the optimal structure for obtaining, after reflow under these set temperature and time conditions, the structure closest to the sought structure;
  the invention also makes it possible to define both the initial structure and the optimal reflow conditions for obtaining the structure closest to the sought structure.

Typically, if, in practice, it is not possible to exceed a certain number of different levels of height, notably because this is not permitted by the lithography equipment available, the invention makes it possible to define the shape of the initial structure and the reflow temperature. The invention thus makes it possible to considerably reduce the costs of obtaining complex structure such as for example structures having three-dimensional patterns.

For example within the scope of the invention, perfectly surprisingly, it was found that, in order to obtain domes, the most desirable initial structure is frequently a pyramid which subsequently undergoes reflow and not an initial structure consisting of stacked cubes approximating a dome.

The invention makes it possible to obtain varied profiles and notably profiles having curves or profiles wherein the tangents develop continuously along the profile. It makes it possible to obtain angles, however slightly rounded due to the reflow, but does not make it possible to obtain genuinely sharp edges, i.e. profiles wherein the tangents do not develop continuously.

Optionally, this method according to the invention may further have the following optional steps and features:

Advantageously, the residual layer covers the substrate entirely.

More generally, the residual layer surrounds each pattern such that all the lines or edges along the contour of each pattern are only in contact with an ambient medium wherein the initial structure is situated and are thus not in contact with the substrate supporting the thermo-deformable layer. As such, the initial structure has no line or edge along the contour of the thermo-deformable layer which is in contact both with the ambient medium and the substrate supporting the thermo-deformable layer.

Preferably, the initial structure only has double points, also known as double lines or double interfaces. The term double point refers to a point of the sheath of a structure (also known as a pattern) which is in contact with a single medium. As such, all the points of the sheath forming the initial structure are only in contact with a single material: the surrounding air. At no point is this surface in contact with another material such as the substrate supporting the initial structure.

According to a further embodiment, the initial structure has triple points or triple lines, in contact both with an ambient medium and the substrate supporting the layer of thermo-deformable material, the triple points being separated from each pattern by a distance at least equal to Dmini, where $$D \min i=2 \operatorname{Max}(hr,hd,\lambda) \text{ and preferably } D \min i=5 \operatorname{Max}(hr,hd,\lambda)$$

where hr=mean thickness of the residual layer between the pattern closest to the triple point and the triple point; where hd=height of the pattern closest to the triple point. The height of a pattern is measured between the highest point of the pattern and the base of the pattern. The base of the pattern is situated at the free surface of the residual layer. The height thus corresponds, for a residual layer of constant thickness arranged on a substrate wherein the upper face is plane, to the difference between the height of the pattern measured from the upper face of the substrate and the residual thickness measured from said upper face of the substrate and; where $\lambda$=the distance mutually separating the two patterns which are closest to the triple point.

As such, whether the thermo-deformable layer covers all the substrate or not, none of the patterns has an interface with the substrate or with an underlying layer thereto.

Advantageously, besides the patterns, the residual layer has a substantially constant thickness. This means a thickness which does not vary by more than 10% with respect to the mean thickness of the residual layer situated below the patterns. This non-limiting embodiment enables easier implementation of the invention.

Preferably, the thermo-deformable layer forms a residual layer extending substantially in one plane, each pattern extending from this plane such that each pattern only has an interface with the surrounding medium.

The patterns are hollow or projecting patterns.

Advantageously, the steps for predicting, computing correlation values and identifying the reflow parameters are repeated with a plurality of initial structures wherein the geometries are different to one another.

Advantageously, among the plurality of initial structures, the initial structure suitable for obtaining the highest correlation value is identified.

Advantageously, the steps for predicting, computing correlation values and identifying the reflow parameters are repeated with a plurality of initial structures wherein the geometries are different to one another only if the highest correlation value for a given initial structure is less than a predetermined correlation threshold.

According to one advantageous embodiment, a maximum reflow temperature is set.

According to one embodiment, a maximum reflow time is set.

Advantageously, the step for predicting the progression over time of the geometry of the initial structure subject to reflow is dependent on the thickness of the residual layer.

Advantageously, at least two reflow modes are defined: one based on a thick residual layer where capillarity phenomena are predominant, the other based on a thin layer where non-linear lubrication phenomena are dominant.

Advantageously, the initial structure is formed at least in part by overlaid cubes or blocks.

According to one advantageous embodiment, the initial structure has a triangular cross-section along a section perpendicular to the substrate plane.

According to one advantageous embodiment, the mold of triangular cross-section patterns is obtained by preferential chemical etching along the crystallographic planes of a semi-conductor material comprising silicon.

According to one advantageous embodiment, the final structure comprises one or a plurality of aspherical lenses or one or a plurality of Fresnel lenses.

According to one advantageous embodiment, the predicted structure (S3) offering the highest correlation value forms a topography for boosting light emission in LED devices.

Advantageously, the steps for predicting, computing correlation values and identifying reflow parameters of the method are performed by at least one microprocessor.

According to one advantageous embodiment, the predicted structure (S3) offering the highest correlation value is a structure for a tool for fabricating a microelectronic device or a structure of a microelectronic device.

The term microelectronic device denotes any type of device embodied with microelectronic means. These devices include notably in addition to devices for purely electronic purposes, micromechanical or electromechanical devices (MEMS, NEMS, etc.) along with optical or optoelectronic devices (MOEMS, etc.)

As such, it emerges that the method according to the invention based on a simulation using a very specific structure, i.e. with no "triple point" in the vicinity of the patterns, fulfils specific technical functions for modern engineering suitable for predicting, in concrete terms, the reflow conditions for obtaining a shape very similar to that sought.

The invention makes it possible to guide the design process of the initial ape and the fabrication process (notably the reflow temperature and time parameters) with a precision such that it is possible to estimate the chances of success of a reflow operation before even performing this operation in concrete terms. Moreover, the method according to the invention is suitable for determining the optimal initial shape that should undergo reflow to obtain the sought structure.

With existing techniques, identifying the optimal reflow conditions and identifying the initial structure to undergo reflow predictively or choosing, in a set of reflow parameters and initial structures, those offering the best chances of success, would be costly and would be time-consuming.

Moreover, since it is suitable for determining the optimal initial shape and the reflow conditions, the present invention thus constitutes a concrete and convenient tool for those skilled in reflow.

The method according to the invention is implemented by a computer comprising at least one microprocessor.

According to a further aspect, the present invention relates to a computer program product or a non-transitory computer-readable medium, comprising instructions, which when carried out by at least one processor, executes the steps of the method according to the invention mentioned above. These steps are at least the steps for predicting, computing correlation values and identifying reflow parameters.

According to a further embodiment, the invention relates to a method for obtaining at least one structure approximating a sought structure from at least one initial structure, different to the sought structure, the initial structure consisting of at least one pattern formed in a thermo-deformable layer arranged on a substrate, characterized in that the thermo-deformable layer forms a residual layer surrounding each pattern and from which each pattern extends such that each pattern has an interface only with the surrounding medium and in that the method comprises the following steps:

- a step for predicting the progression over time of the geometry of the initial structure subject to reflow, so as to obtain a plurality of predicted structures each associated with reflow parameters comprising at least a reflow time and a reflow temperature;
- a step for computing correlation values of the geometry of each predicted structure with respect to the sought structure;
- a step for identifying reflow parameters for obtaining the predicted structure offering the highest correlation value.

Preferably, said identified reflow parameters are supplied to a reflow apparatus.

The method also comprises a step for reflow of the initial structure, the reflow step being performed by applying the reflow parameters for obtaining the predicted structure offering the highest correlation value.

The reflow apparatus performs the reflow step. Preferably, during the reflow step, said apparatus applies said identified reflow parameters. The reflow apparatus notably comprises:

- a device for bringing the thermo-deformable layer to a given temperature;
- a device for controlling the temperature of the thermo-deformable layer;
- a device for controlling the time during which the temperature of the thermo-deformable layer is subject to a given temperature;
- a computerized device for reading instructions in order to apply parameters, notably in respect of temperature and time, during a reflow step.

Optionally, this method according to the invention may further have the following optional steps and features.

Advantageously, the steps for predicting, computing correlation values and identifying the reflow parameters are repeated with a plurality of initial structures wherein the geometries are different to one another. Advantageously, among the plurality of initial structures, the initial structure suitable for obtaining the highest correlation value is identified.

Advantageously, the reflow step is performed based on said identified initial structure and the reflow parameters for attaining the highest correlation value for this identified initial structure.

According to one advantageous embodiment, the initial structure is obtained by imprinting the layer of resin using a mold.

According to one advantageous embodiment, the initial structure is obtained by grayscale photolithography including the presence of a residual layer.

According to a further embodiment, the invention relates to a method for simultaneously obtaining by means of reflow, at wafer level, arrays of three-dimensional patterns having possibly complex arbitrary profiles. The method comprises the following steps:

- an initial profile of the patterns formed in a thermo-deformable resin is determined by simulation, said initial profile comprising a residual layer of control thickness different to zero;
- reflow conditions including at least an optimal reflow temperature and time are determined by simulation;
- the two preceding steps are repeated, until by means of successive approximations a predetermined correlation value between the profile obtained and that sought is obtained, by simultaneously or successively correcting either the initial profile and the residual thickness, or the reflow conditions, or both;
- the simulation results are accumulated and the profile and/or the reflow conditions for obtaining the best correlation value are determined.

According to a further aspect, the present invention relates to a computer program product or a non-temporary computer-readable medium, comprising instructions, which when carried out by at least one processor, executes the steps of the method mentioned above.

According to a further embodiment, the invention relates to a method for fabricating a mold for nanometric imprinting bearing a plurality of structures intended to penetrate into a deformable material intended to imprint in this material said plurality of structures, the fabrication method being characterized in that the structures are obtained by performing the steps of the method according to the invention.

BRIEF DESCRIPTION OF THE FIGURES

The aims, subject matter, and features and advantages of the invention will emerge more clearly from the detailed description of an embodiment thereof which is illustrated by the following accompanying drawings wherein.

The drawings are given by way of examples and do not restrict the invention. They constitute schematic basic representations intended for easier comprehension of the invention and are not necessarily to scale of the practical applications. In particular, the relative dimensions of the various patterns and layers are not representative of reality.

DETAILED DESCRIPTION OF THE INVENTION

Within the scope of the present invention, it is specified that the term "on", "tops", "covers" or "underlying" or the equivalents thereof do not necessarily mean "in contact with". As such, for example, depositing a layer on a substrate does not necessarily mean that the layer and the substrate are directly in contact with one another but this means that the layer at least partially covers the substrate while being either in direct contact therewith or being separated therefrom by a further layer or a further element.

Within the scope of the present invention, the term three-dimensional pattern denotes a pattern having in a given layer, for example a resin, at least two levels of height above an upper face of the layer when the pattern is projecting or at least two levels of depth below the upper face of the layer when the pattern is hollow. The three-dimensional pattern may have a curved profile.

Before describing an embodiment of the present invention in detail, a solution according to the prior art will be commented on for easier understanding of the invention.

Figure 1:
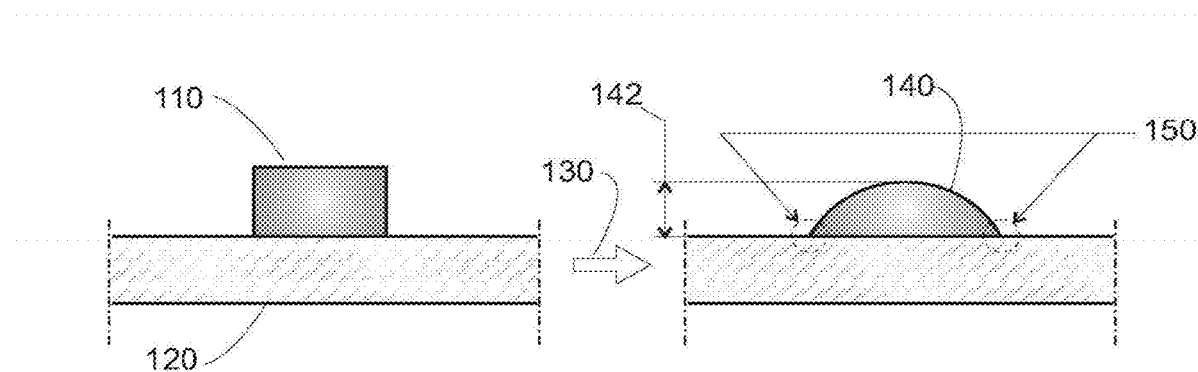
FIG. 1 illustrates the prior art and the standard formation of microlenses using reflow.

The document cited above in the section on the prior art, "Technique for monolithic fabrication of microlens arrays" (Z. D. Popovic et al.) aims to provide a solution for forming reproducibly and in a limited series of operations spherical microlenses arrays. The authors describe therein a method for the reflow of a polymer resin, such as the photosensitive resins used by photolithography, which makes it possible to form microlenses. As shown in FIG. 1, a cylinder or a line of resin 110, generally having a substantially rectangular cross-section, is generally created by photolithography on a substrate 120, and is heated during an annealing operation 130 until the cross-section acquires a substantially spherical shape 140 thus providing the lens with the optical properties thereof.

The microlenses obtained using this method may however merely have a small thickness 142 so as not to degrade the optical characteristics of the microlens. Only long focal lengths are thus obtained using this method.

The annealing is performed on a structure having triple lines, or so-called triple points, 150 where three elements interact: the air, the polymer resin and the material of the substrate. The sheath of the structure 110, 140 indeed has at the base thereof a contour (rectangular for the linear structure 110 or circular for the cylindrical structure 110 and for the spherical structure 140) formed by a multitude of points which are in contact with two materials in addition to the material of the structure per se. As such, each point of this contour is in contact with the surrounding air and the substrate. The free surface of the thermosetting layer forming the pattern 110, 140 is in contact with the substrate 120 at the base of the pattern.

Within the scope of the development of the present invention, it was discovered that it is mostly the presence of triple points which renders the prediction of the final shape of the microlens after reflow extremely complex. It was also observed that the final shape is strongly dependent on the underlying substrate and parameters such as surface tensions and wetting angles defined at the triple points. Consequently, in practice, it is only possible to obtain using this method a very limited number of shapes and it is always necessary to conduct numerous prior trials to approximate a possible shape which may however be substantially removed from the shape ideally sought for a given application. For example, with the above method, it is only possible to create microlenses of substantially spherical shape by means of reflow.

Figure 2:
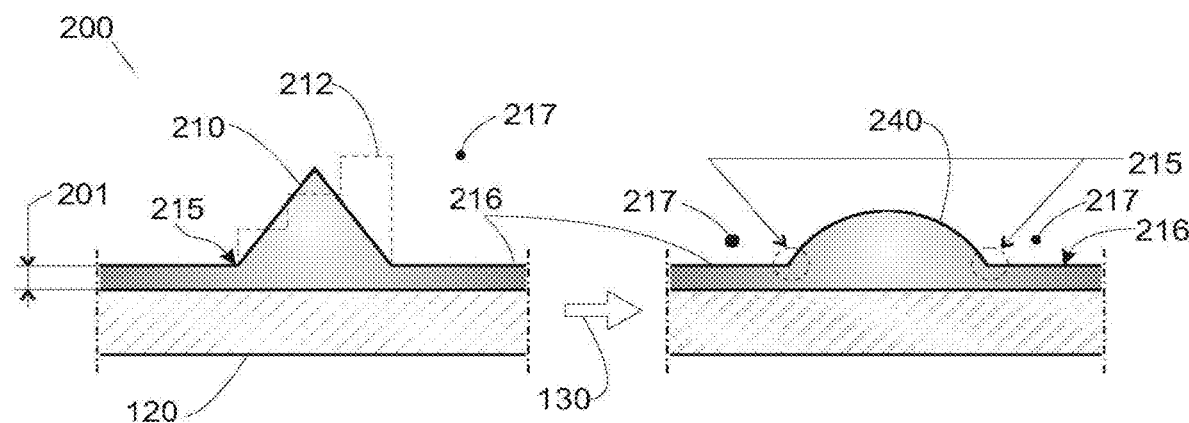
FIG. 2 illustrates the method according to the invention wherein a residual layer is provided during the reflow.

As illustrated by FIG. 2, the invention provides a solution to these problems by describing a method wherein the reflow of a material is always performed by maintaining a residual layer 201. As such, there is no triple point 150 in the vicinity of the pattern(s). The initial structure 200 is continuous. The triple points are replaced by double points 215 referred to herein formed by the single thermo-deformable/surrounding medium interface. The surrounding medium, referenced 217 is herein typically air. The term double point 215 thus refers to a point of the sheath of the structure 200 which is in contact with a single medium (air) 217 in addition to the material of the thermo-deformable layer. As such, the free surface of the layer forming the initial structure 200 is not in contact with another medium such as the substrate supporting the initial structure 200 even at the base of the initial structure 200. As such, the initial structure 200 has not have any line or edge along the contour of the thermo-deformable layer and which is in contact both with the ambient medium 217 and the substrate 120 supporting the thermo-deformable layer.

In the description hereinafter of the invention, it should be noted that such a profile is described as "continuous profile". Within the scope of the invention, an array of three-dimensional patterns 210 formed in the same material, without having any discontinuity of the material between the raised portions of three-dimensional patterns formed before reflow, is a continuous profile. A continuous profile according to the invention is thus most generally characterized, as mentioned above, by the presence of a continuous residual layer 201. The patterns 210, herein projecting raised portions, formed before reflow may be generally of any shapes. They may be, for example triangular as illustrated in FIG. 2 or comprise one or a plurality of discrete levels 212 as illustrated with a dotted line. As a general rule, the shape thereof is chosen to obtain, after reflow, the most suitable shape 240 for the application in question.

Conversely, a shape is considered to be non-continuous if the layer wherein the pattern is formed, typically resin, is discontinued. Such would be the case with an array of contacts 110 arranged on a substrate 120 with no material continuity.

Unexpectedly, it was observed that the presence of the residual layer 201 makes it possible to predict reliably and reproducibly the final shape 240 obtained after annealing 130. In this case, the development of the shape of the initial patterns 230, which takes place during the annealing operation 130, is the same regardless of the underlying substrate whereas this has a significant influence on the dynamics of the triple points in the case of reflow without a residual layer. Moreover, the choice of thickness of the residual layer gives an additional degree of freedom for controlling the final profile 240 of the microlenses as seen hereinafter.

The invention relates to wafers, wherein a substrate is entirely covered with a layer wherein the patterns are formed. It extends nonetheless to wafers wherein the substrate is partially covered with such a layer. As a general rule, this layer extends below all the patterns to undergo controlled reflow (patterns which will have an operational function after reflow). More specifically, this layer extends below all the patterns to undergo controlled reflow and up to a minimum distance separating these patterns from any triple points due to a discontinuity of the layer.

Preferably, when the layer according to the invention defines a triple point, the pattern closest to this triple point must be separated from this point by a distance greater than or equal to the distance Dmini, where Dmini is defined by the following equation:

$$D \min i = 2 \operatorname{Max}(hr, hd, \lambda) \text{ and preferably } D \min i = 5 \operatorname{Max}(hr, hd, \lambda)$$

where hr=mean thickness of the residual layer between the pattern closest to the triple point and the triple point; where hd=height of the pattern closest to the triple point. The height of a pattern is measured between the highest point of the pattern and the base of the pattern. The base of the pattern 210, 240 is situated at the free surface 216 of the residual layer situated between two patterns. The height thus corresponds, for a residual layer of constant thickness arranged on a substrate 120 wherein the upper face 216 is plane, to the difference between the height of the pattern measured from the upper face of the substrate and the residual thickness measured from said upper face of the substrate and; where λ=the distance mutually separating the two patterns which are closest to the triple point.

The thicknesses and heights are measured along a direction perpendicular to the main faces of the substrate supporting the layer wherein the patterns are formed. In the figures, the direction of measurement of the thicknesses and heights is vertical.

As such, subject to meeting this requirement in respect of distance between the triple points and the patterns to be deformed by reflow, the invention extends to wafers wherein the layer defining the patterns forms one or a plurality of separate zones and partially covering the underlying substrate.

Naturally, the invention is not limited to stacks of layers wherein the layer wherein the patterns to undergo reflow are formed is in direct contact with the substrate. It also extends to stacks of layers wherein one or a plurality of layers or other elements are arranged between the substrate and the layer wherein the patterns to under reflow are formed.

Figure 3:
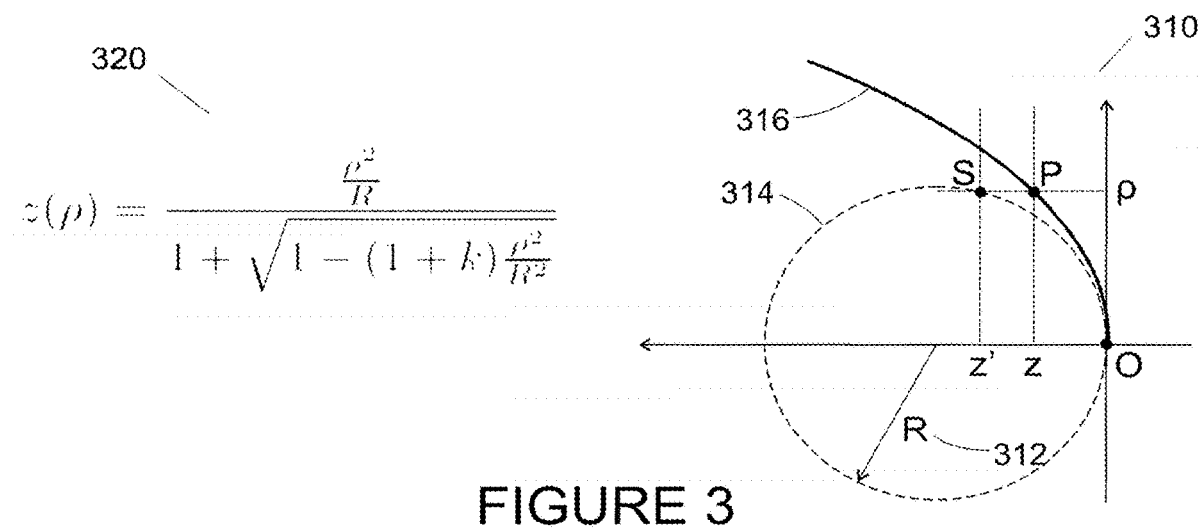
FIG. 3 discusses the features of aspherical lenses.

The method according to the invention makes it possible, for example, to form so-called aspherical microlenses wherein the profile and mathematical expression 320 thereof are illustrated in FIG. 3. Aspherical lenses are conventionally defined using two main parameters: the radius of curvature "R" 312 thereof and the degree of conicity "k" thereof according to the equation 320. The diagram 310 in FIG. 3 illustrates the difference between a spherical profile 314 and an aspherical profile 316. In the equation 320, the aspherical deformation constants of order greater than two have been ignored. When k=0, the lens is spherical, where k is greater than −1, it is elliptical, where k is equal to −1, it is parabolic and finally when k is less than −1, the lens is hyperbolic. The lenses described as aspherical are all those where k is different to zero.

By carefully controlling the profile of the aspherical lenses, they may not be affected by convergence and blurriness problems at wide apertures observed with spherical lenses. The use of aspherical microlenses adapted to the chosen application is conveyed by a spectacular increase in optical performances, a single aspherical lens then suffices to obtain a very good image at any focal length. They make it possible to drastically reduce the number of lenses of optical systems, while notably enhancing performances.

The invention provides a simple solution for the fabrication of aspherical microlens arrays by enabling the optimal microlens profile to be obtained directly following the reflow operation and without subsequent processing of each lens. The method according to the invention is not limited to this example of application and is suitable as a general rule for the formation of complex 3D shapes for all kinds of applications. In particular, the reflow method according to the invention will be advantageously used for the fabrication of molds for imprinting patterns of micrometric or nanometric sizes.

Figure 4A:
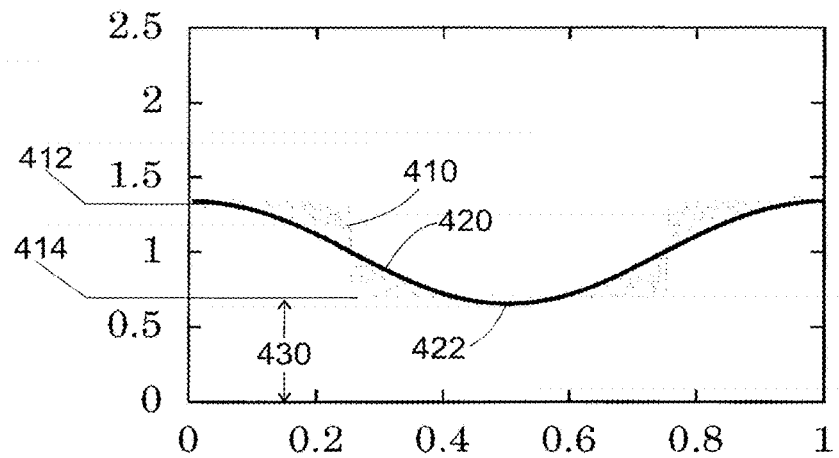
FIGS. 4a and 4b illustrate a simulation of the effect of the annealing step after imprinting in the resin of a simple structure having a rectangular cross-section leaving in place, respectively, a thick layer and a thin residual layer of resin.
Figure 4B:
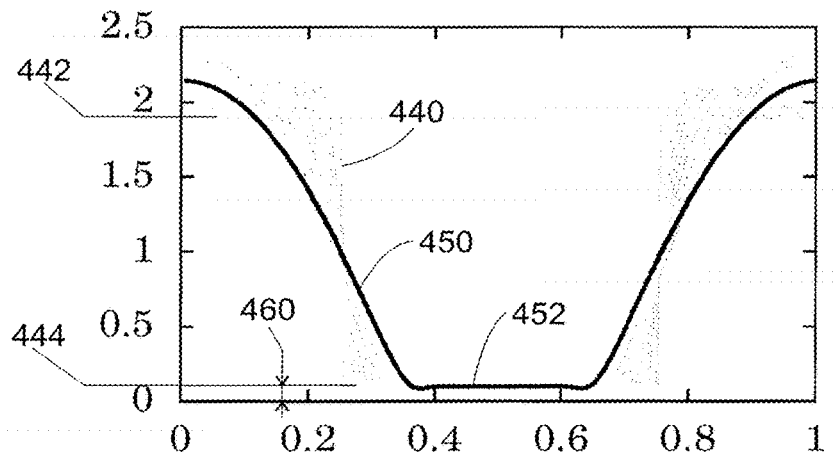

FIGS. 4a and 4b illustrate a simulation of the effect of the annealing step after imprinting in the resin of a simple structure of rectangular cross-section, 410 and 440 respectively, each comprising merely two different imprinting levels 412 and 442 on one hand and, on the other, 414 and 444. FIGS. 4a and 4b make it possible to compare the effect of a thick residual layer 430 and that of a thin layer 460 on the final shapes obtained after reflow, i.e. 420 and 450. It is observed that a thick residual layer 430 produces a rounded pattern base 422 whereas a thin residual layer 460 produces a flat pattern base 452. The residual thickness is thus indeed, as mentioned above, an important factor for controlling the final shape of the profiles 420 and 450. The diagrams in FIGS. 4a and 4b use on the x-axis and y-axis dimensionless standardized values which are, respectively, those of the width and height of the simulated patterns.

It should be noted herein that the simulation modes of the final shape which are implemented by the invention make use of models of resin behavior during reflow which are of very different natures depending on whether the residual layer is thin or thick. If the layer is thick as in the example FIG. 4a, capillarity phenomena are then predominant. If the layer is thin as in the example in FIG. 4b, the behavior of the resin is then governed by lubrication type models.

The method for determining which of the models is to be used, among the capillarity phenomenon model and the lubrication model, will be detailed hereinafter with reference to FIG. 11.

Figure 5:
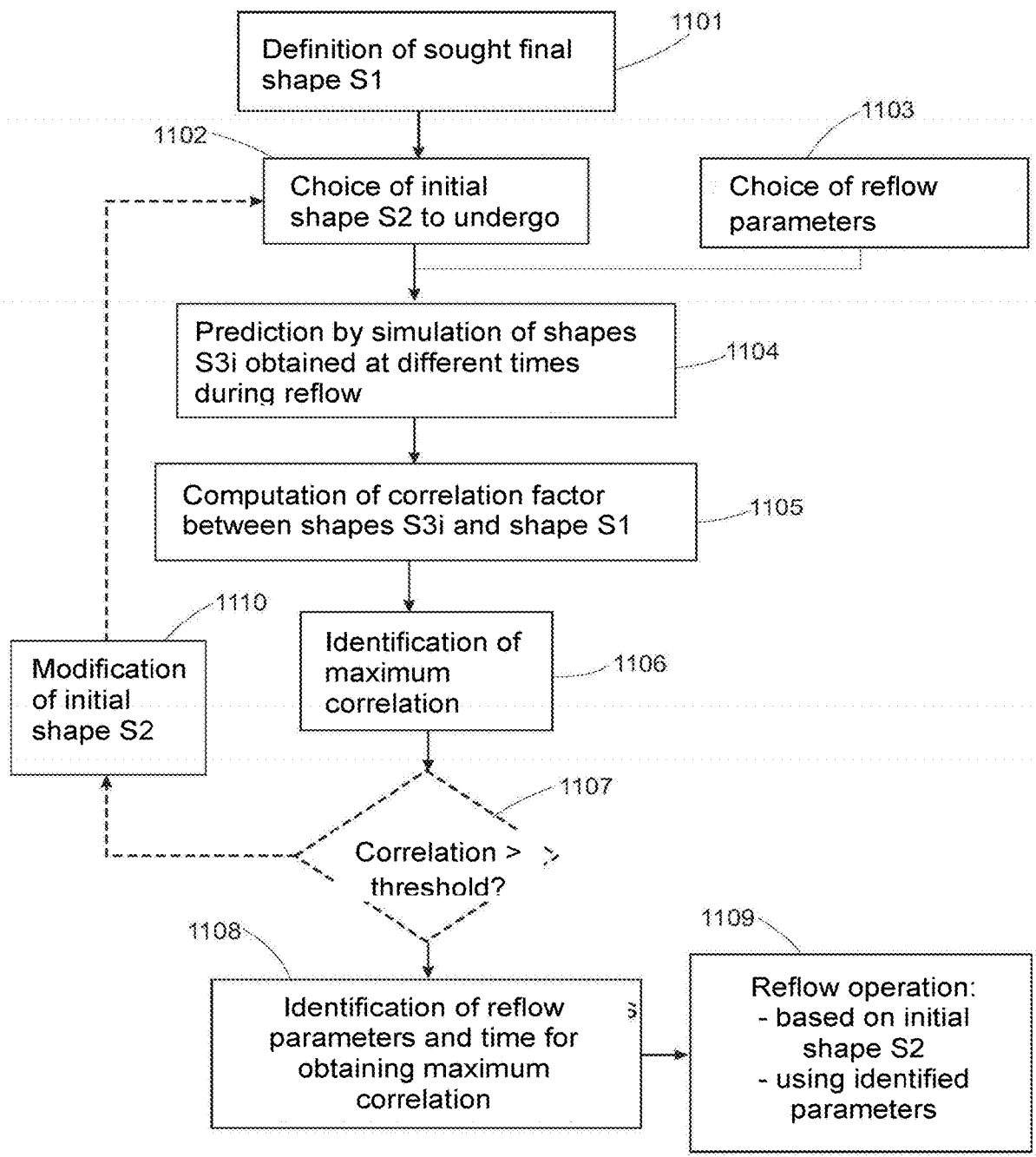
FIG. 5 illustrates the steps of an example of a method according to the invention which makes it possible to determine the reflow conditions suitable for obtaining a structure identical or similar to a sought structure.

FIG. 5 illustrates the steps of an example of a method according to the invention for determining the reflow conditions suitable for obtaining a structure identical or similar to a sought structure. One step 1101 consists of defining a sought shape, also referred to as a sought structure S1, that should ideally be obtained. This shape may be chosen freely. For example, an aspherical microlens shape may be chosen.

The step 1102 comprises the choice of an initial shape S2 based on which the reflow operation will be performed. This step also comprises the numerical or mathematical representation of this shape S2. Particularly advantageously, this shape has a residual layer as defined above, i.e. a layer extending below the patterns to remove any triple point or repel any triple points to a sufficient distance from each of the patterns the development whereof is to be controlled by reflow.

The choice of the initial shape S2 is dependent on numerous parameters and notably the embodiment techniques and practical constraints. This shape will differ for example according to the lithography technique used. Moreover, for the same lithography technique, this shape will be dependent on the equipment used. For example, if the embodiment involves a nanoimprint, this shape will be dependent on the number of levels of the mold.

It is also possible to define reflow parameters such as the reflow temperature (step 1103) and time. This step makes it possible for example to define a maximum temperature making it possible not to damage other layers of components of the stack of layers to which the layer to undergo reflow belongs.

During the step 1104, a simulation of the progression over time of the initial shape S2 during reflow is performed. At each time, under the effect of reflow, the simulation predicts a shape S3. Following the simulation, there are therefore n shapes $S3_i$, each corresponding to a reflow time. For example, the prediction of the shape S3 at the time t=0, i.e. when the reflow has not yet started, provides a shape $S3_0$ identical to the initial shape S2 since this initial shape has not yet undergone any modification. The prediction of the shape S3 at the time t=∞, i.e. after a sufficiently long time so that the shape S3 no longer changes, provides a plane shape $S3_\infty$, all the patterns of the initial shape S2 having been entirely smoothed.

In order to make these predictions of the shapes $S3i$, the equation mentioned above is advantageously used. A computing unit equipped with a microprocessor makes these predictions and uses the equations adapted to the initial shape S2.

The step 1105 illustrates the computation of a correlation factor between the shapes $S3i$ predicted by simulation and the sought shape S1. It typically consists of the ratio of the covariances and the product different to zero of the standard deviations. These computations may be performed at the end of the simulation as illustrated in the graph or be performed in parallel with the simulation in the step 1104, i.e. as the predicted shapes $S3i$ are determined.

The step 1106, performed at the end of simulation or in parallel with the step 1105 comprises the identification of the predicted shape $S3i$ making it possible to obtain the best correlation factor.

According to a first embodiment, the step 1106 leads directly to the step 1108 during which the reflow parameters for obtaining this shape $S3i$ for which the correlation is the best are determined. The reflow parameters are selected from among: the reflow temperature, the reflow time.

The method comprising the preceding steps thus makes it possible to determine the optimal reflow conditions based on a given initial shape S2. As such, by setting an initial structure, for example to meet constraints associated with the lithography equipment available, the invention makes it possible to identify the optimal reflow temperature and time for this initial structure.

Following this method for determining the optimal reflow conditions, it is then possible to embody the initial structure S2 and have it undergo reflow under these conditions. This embodiment step 1109, following the simulation method, may optionally be incorporated in the invention.

According to a second embodiment, the simulation method comprises additional and optional steps for optimizing the initial structure by performed successive iterations.

Following the step 1106, it is determined whether the highest correlation factor obtained based on the initial shape S2 is greater than or equal to a predetermined correlation threshold (step 1107).

If this correlation factor is greater than the threshold, then the step 1108 is performed. The initial shape S2 and the optimal reflow parameters are retained. The method for predicting and determining the parameters then ends and the reflow operation 1109 can be performed.

On the other hand, if the correlation factor is less than the threshold, then an additional step 1110 for modifying the initial shape S2 is performed. Then the steps 1103 to 1107 are once again performed based on the modified initial shape S2. These iterations are repeated until a correlation factor greater than the threshold is obtained.

This embodiment then makes it possible to determine both the initial structure and the reflow parameters for obtaining a final shape S3 identical or similar to the sought shape S1.

It should be noted that it is possible to perform this method with modifications of the initial shape S2 (step 1110) without using a correlation threshold. Indeed, it is possible to perform as many iterations as the number of initial shapes to be tested.

It should also be noted that this method may also be reiterated by merely modifying the reflow parameters of the step 1103 and in particular the reflow temperature and the reflow time. The invention thus makes it possible to determine the ideal reflow temperature and reflow time for a given initial shape S2.

As such, by setting a maximum reflow time, for example in order to meet industrial productivity requirements, the invention makes it possible to identify the optimal reflow temperature for a given structure.

Similarly, by setting a maximum reflow temperature, for example for retaining the integrity of the underlying layers or of components surrounding the patterns, the invention makes it possible to identify the optimal reflow time for a given structure.

It should be noted that this method may also be reiterated by modifying both the reflow parameters of the step 1103 and the initial shape S2 (step 1110 and 1102). The invention thus makes it possible to determine the optimal initial shape S2 and the ideal reflow temperature and reflow time for this optimal initial shape S2.

Preferably, at least the steps 1104 to 1108 are performed by a microprocessor.

Figures 6A, 6B:
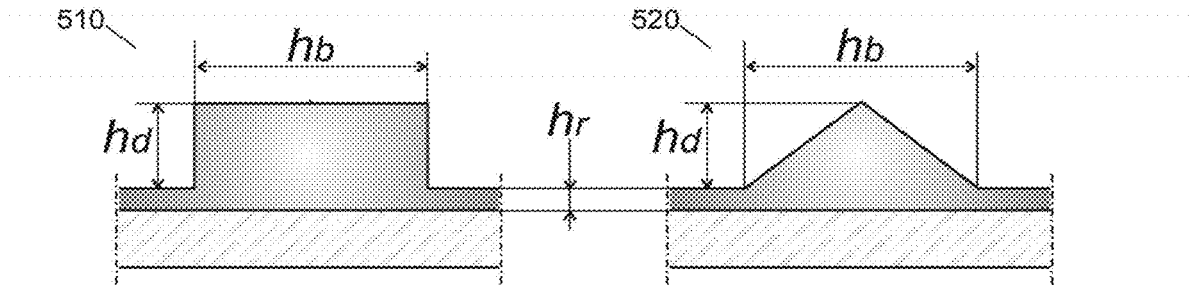
FIGS. 6a and 6b illustrate two types of initial profiles, one rectangular and the other pyramidal, used to form an aspherical microlens array.

FIGS. 6a to 6d illustrate the simulation results which may for example be obtained by following the steps in FIG. 5. In this illustrative example, these simulations are intended to define the conditions for forming an aspherical microlens array based on two initial profiles, one rectangular 510 and the other pyramidal 520 as shown in FIGS. 6a and 6b respectively. The geometric parameters which will influence the final shape after reflow are, as indicated, the thickness of the residual layer hr, the height of the patterns hd and the width hb thereof. The other parameters determining the final shape of the lenses are obviously the reflow temperature and time.

Figures 6C, 6D:
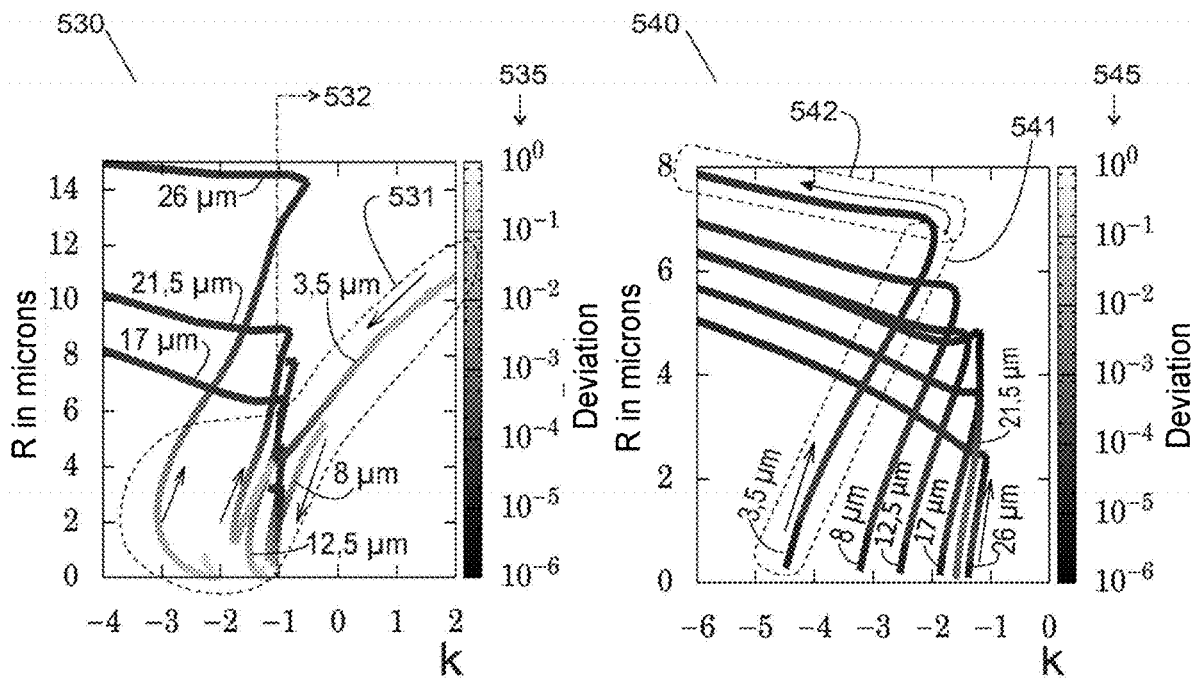
FIGS. 6c and 6d illustrate simulation results with a view to defining the conditions for forming an aspherical microlens array based on two types of initial profiles illustrated in FIGS. 6a and 6b.

FIGS. 6c and 6d show, using the diagrams 530 and 540, the concomitant progression, during the reflow phase, of the conicity parameters (R and k) of the aspherical lenses obtained respectively based on a rectangular profile 510 and a pyramidal profile 520 for various values of the geometric parameters: hr, hd and hb.

It should be noted that for FIGS. 6d and 6c, the repetition period of each of the patterns is 15 µm, the value of hb is 14 µm and that of hr is 500 nm.

The six curves featured in FIGS. 6c and 6d correspond to six different values of hd which are: 3.5 µm, 8 µm, 12.5 µm, 17 µm, 21.5 µm and 26 µm, as indicated directly therein.

The increasing reflow times are indicated by the direction of the arrows. The following conclusions can be drawn from the observation of these curves:

The progression curves of the parameters R and k mostly exhibit the same type of behavior in both diagrams. With reference for example to the diagram 540, in a first phase 541, with the increase in the annealing time, a simultaneous increase in the parameters R and k is observed. The positioning of the various curves is essentially dependent on the initial profile selected and the associated geometric parameters.

In a second phase 542, when the annealing time continues to increase, while the parameter R continues to increase much more slowly, a very rapid decrease in the parameter k is observed.

It is also possible to note that the correlation or deviation between the sought shape, i.e. that corresponding to the equation 320 in FIG. 3, and that obtained by simulation, i.e. that represented in the diagrams, is always very close to 1 except in the zone 531 of the diagram 530, corresponding to the choice of a rectangular initial profile 510. For this diagram, a poorer correlation is observed for short annealing times. This observation may be made on the diagrams 530 and 540 using scales on the y-axis, 535 and 545, situated to the right thereof and which indicate, in grayscale on the curves, the degree of correlation in the form of a parameter $(1-R^2)$ measuring the deviation with the square of the coefficient of correlation (R). The lowest deviation values correspond to the darkest tones.

It should be noted in the diagram 540 that only hyperbolic lenses (k less than −1) can be embodied based on a pyramidal initial profile. In this case, the conicity parameters may be adjusted based on the initial shape of the pyramid (angle) and the annealing time.

As mentioned above, the correlation at the start of annealing (zone 531 of the diagram 530) is lower when based on rectangular shapes. However, it is possible in this case to embody elliptical microlenses 532, i.e. with a parameter k having a value greater than −1.

Figure 7A:
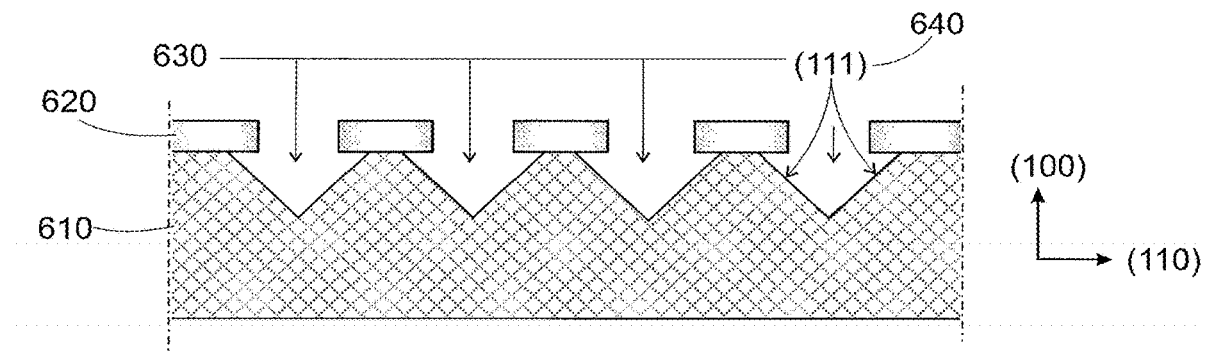
FIGS. 7a and 7c briefly describe an example of a method suitable for forming pyramidal-shaped initial patterns in a polymer resin.
Figure 7B:
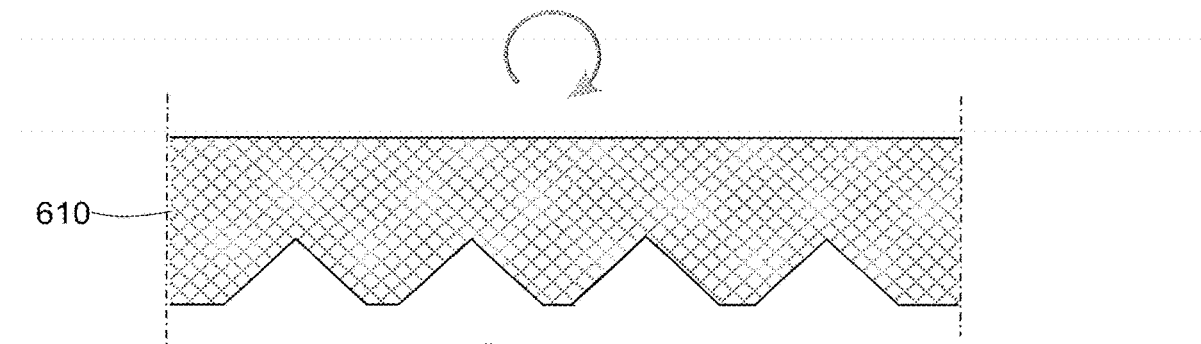
Figure 7C:
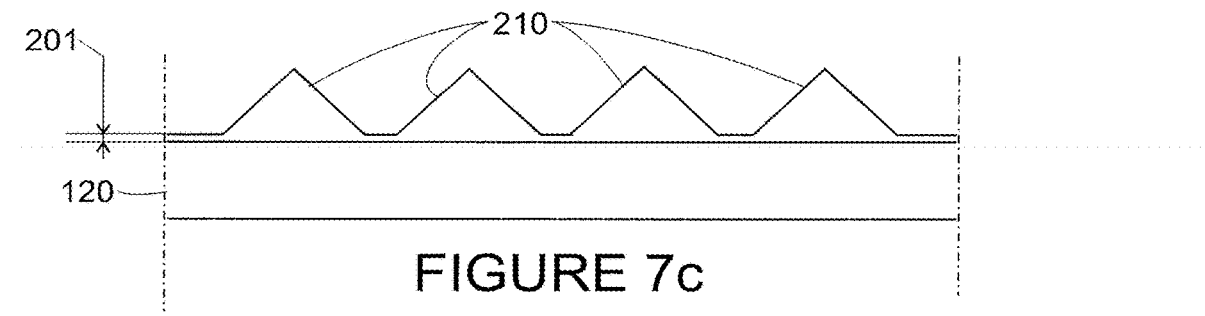
Figure 8A:
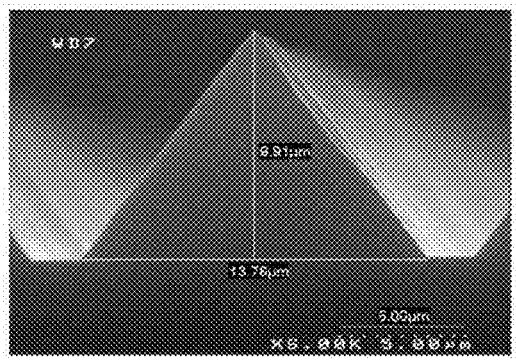
FIGS. 8a to 8e show results of annealing experiments conducted using pyramidal patterns resting on a thin residual layer.

FIGS. 7a to 7c briefly describe an example of a method suitable for forming, in a polymer resin, pyramids such as those in FIG. 6b or those in FIG. 8a.

A method well-known to those skilled in the art consists of creating an imprinting mold 610 using standard photolithography and etching methods developed by the microelectronics industry. The mold is preferably made of crystalline silicon having a so-called crystalline orientation (111) which is the corresponding Miller index. To obtain the mold, a hard mask 620 is previously created using conventional means on the surface of a silicon substrate. This hard mask 620 will be used for etching 630 the patterns to be imprinted in the silicon. The etching conditions are adapted such that this is preferentially performed according to the crystalline plane (111). Inclined edge etching 640 is thus obtained as represented in FIG. 7a. The etching angle is then substantially 54.7 degrees which corresponds to the crystalline orientation (111) of the substrate.

Those skilled in the art also know how to obtain different etching angles by adjusting the implementation conditions of the etching methods, dry or wet process, routinely used by the microelectronics industry.

FIG. 7b shows the mold 610 after etching, removal of the hard mask and turning. It is then ready to be used for imprinting pyramids in a polymer resin with a view to fabricating, for example, an aspherical microlens array as described above.

FIG. 7c shows a structure of pyramidal patterns 210 before annealing as already represented in FIG. 2. It is obtained in this example of an embodiment by imprinting the mold 610 in a polymer resin previously deposited on a substrate 120. The imprinting leaves a residual layer 201 in place so as to obtain a continuous profile consisting of a single material as discussed above.

Preferably, an antiadhesive layer consisting of a monolayer of molecules containing fluorinated atoms is deposited on the surface of the mold to facilitate the removal thereof after imprinting. The substrate to be structured 120 is for example covered with a film of thermoplastic polymer that can be set thermally or by exposure to UV radiation. A thermoplastic is for example poly (methyl methacrylate) (PMMA) or polystyrene (PS). A polymer that can be set by UV is typically a photosensitive resin such as for example the resin known as SU-8 which is widely used in lithography. The mold and the substrate are heated to a temperature above the glass transition temperature (Tg) of the polymer used. The heating temperature is typically chosen in a temperature range from 10 to 50° C. above the glass transition temperature. The mold is then pressed in the polymer film until the cavities are completely filled. The pressure applied ranges from a few bar to some forty bar. Then, the mold and the substrate are cooled to a temperature below the glass transition temperature and separated.

FIGS. 8a to 8e shows results of annealing experiments performed using pyramidal patterns resting on a thin residual layer forming a structure similar to that in FIG. 7c. The pyramids were imprinted in an SU-8 type resin using a silicone mold as described in FIG. 7. The samples were then heated to 65° C. for various periods of time and then cooled rapidly to ambient temperature. FIGS. 8a to 8d are images obtained using a scanning electron microscope (SEM) for increasing annealing times:

FIG. 8a shows the initial pyramidal pattern after imprinting in the resin. The residual layer (not shown throughout the thickness thereof) has in this case a thickness of 94 nm (nanometer=$10^{-9}$ meter).

Figure 8B:
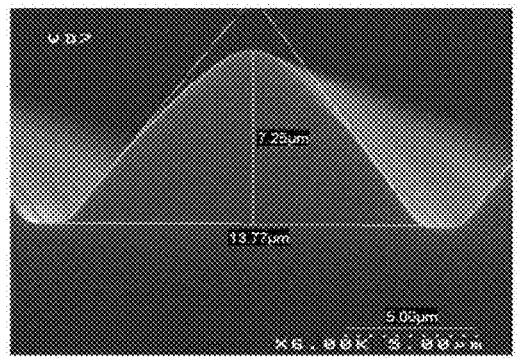
Figure 8C:
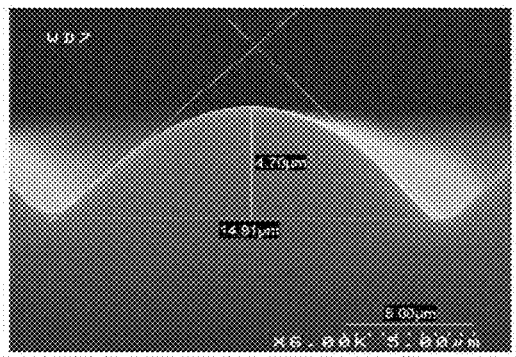
Figure 8D:
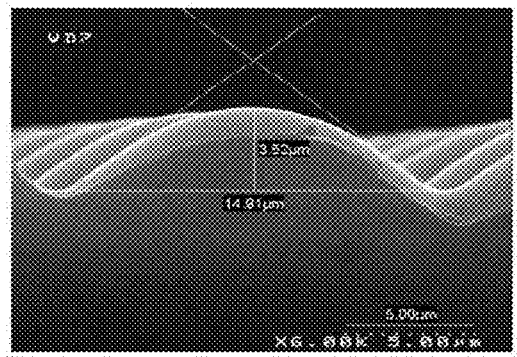

FIGS. 8b to 8c show the progression of the shape of the pyramidal pattern, respectively: after annealing lasting for 1 minute, after 2.5 minutes and after 10 minutes. By increasing the annealing time, a plane shape without a pattern would be obtained.

Figure 8E:
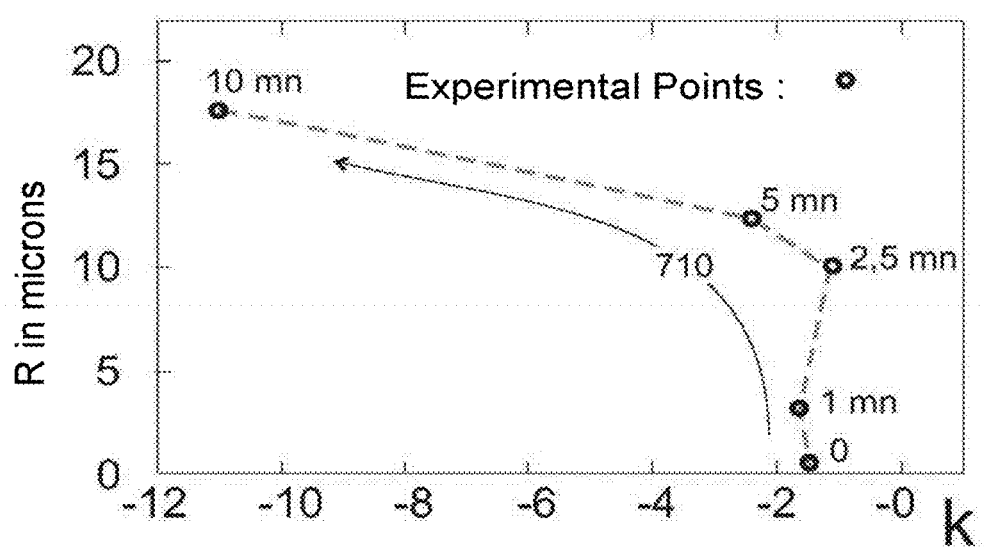

The conicity parameters (R and k) have been computed for the various shapes observed. As shown in FIG. 8e, the same type of progression of the pairs of conicity parameters R,k as a function of the annealing time 710 (in minutes) is found as that obtained by simulation in FIG. 6d.

The invention thus makes it possible to simulate the embodiment of aspherical microlens arrays having the sought conicity. Hence, on the basis of the results of these simulations, it is possible to determine the optimal parameters which will enable us to effectively obtain the sought conicity in terms of an actual reflow operation. It is thus known how to produce with the method according to the invention aspherical microlens arrays for which the conicity can be accurately controlled.

FIGS. 9a to 9e illustrate an implementation of the method according to the invention for the embodiment of so-called Fresnel type microlenses.

Figure 9A:
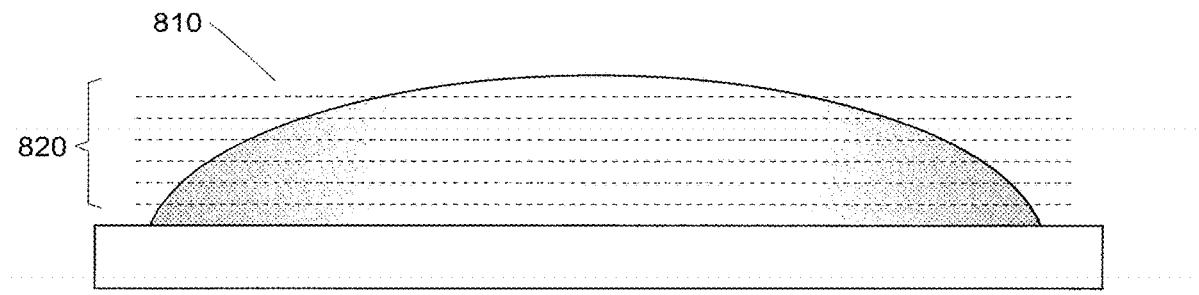
FIGS. 9a to 9e illustrate an embodiment of the method according to the invention for producing Fresnel type microlenses.

FIG. 9a illustrates a large lens 810 (relative to the size of the microlens arrays addressed by the invention) wherein the thickness can become significant for obtaining the optical properties sought. It has been known from the early 19$^{th}$ Century (A. Fresnel) that a convex plane lens can be split into concentric annular sections 820 providing, together, the same optical properties as a single extra-thick lens.

Figure 9B:
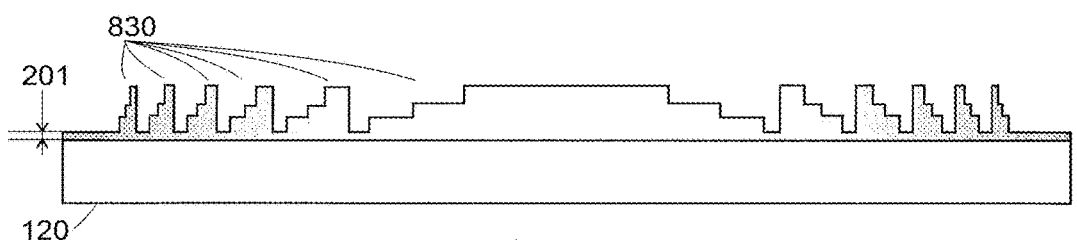

This type of lens may be advantageously embodied with the method according to the invention. As shown in FIG. 9b, the method starts by forming, for example a polymer resin arranged on a substrate 120, concentric rings 830 wherein the profiles are in a first phase approximated by steps of different levels, in varying numbers. These initial patterns are thus formed from a stack of discrete volumes. Therefore, the initial patterns intended to undergo reflow, after which they will acquire the final shape thereof, are formed at this stage. The presence of the residual layer 201 is still observed.

Various methods can be used to embody this type of initial profile in the form of steps retaining a residual layer. For example, it may be obtained by imprinting the corresponding mold in the resin in a similar manner to that described with reference to FIGS. 7a to 7c. It is known how to produce in a standard manner imprinting molds having a plurality of discrete imprinting levels. The number of discrete levels that can be obtained in practice is however very limited and the number thereof has a direct impact on the production cost of the mold.

A further way to obtain the discrete levels of the initial patterns consists of using a particular type of lithography known as "grayscale lithography". In this technique, it is intended to insolate adjacent zones of a photosensitive resin differently such that, after development, the latter exhibits differences in levels which are dependent on the insolation received locally.

The techniques briefly described above are well-known to those skilled in the art.

Figure 9C:
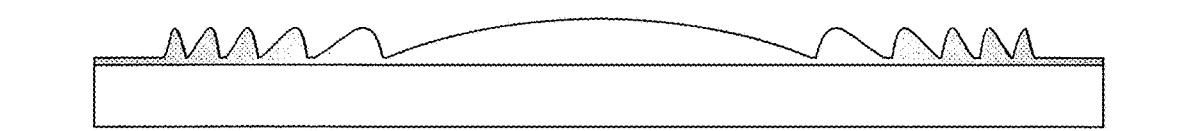

FIG. 9c illustrates the shape obtained after reflow. The reflow conditions are determined predictively. For this, it is possible to apply one of the embodiments of the methods illustrated in FIG. 5.

Figure 9D:
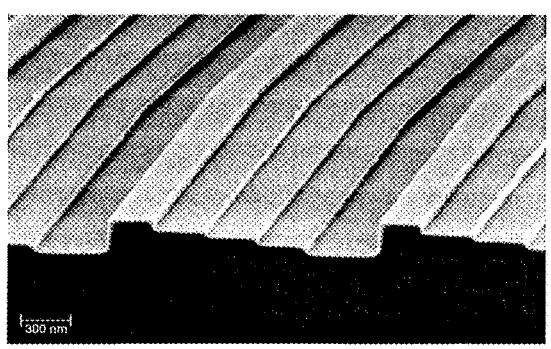

FIG. 9d is a photograph taken using a scanning electron microscope (SEM) showing initial stepped patterns, produced for example by grayscale lithography, which make it possible to obtained, after annealing a Fresnel lens as shown in FIG. 9c.

Figure 9E:
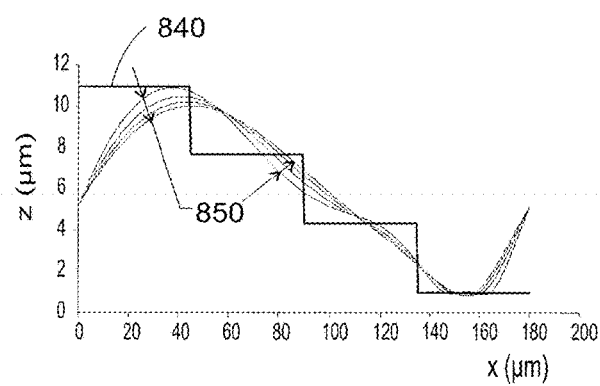

FIG. 9e illustrates the progression of an initial stepped profile 840 after various reflow times 850. A smoothing of the initial shape is obtained which makes it possible to approximate relatively accurately the shape ideally sought by performing simulations as allowed by the presence of a residual layer and adjusting as above the various geometric and physical parameters available: notably, shape and dimensions of the initial profile, thickness of the residual layer, annealing temperature and time.

According to a further embodiment, the 3D shapes produced using the method according to the invention are used for creating an imprinting mold which will in turn be used by a method for producing a particular device. In this case, as already discussed in FIG. 7, the embodiment of the mold may include the steps required for depositing an antiadhesive layer. The embodiment of a mold may also require stabilization of the resin, or of the thermoplastic material used, along with a treatment ensuring the long service life there such as metallization of the surfaces exposed during imprinting.

Figure 10:
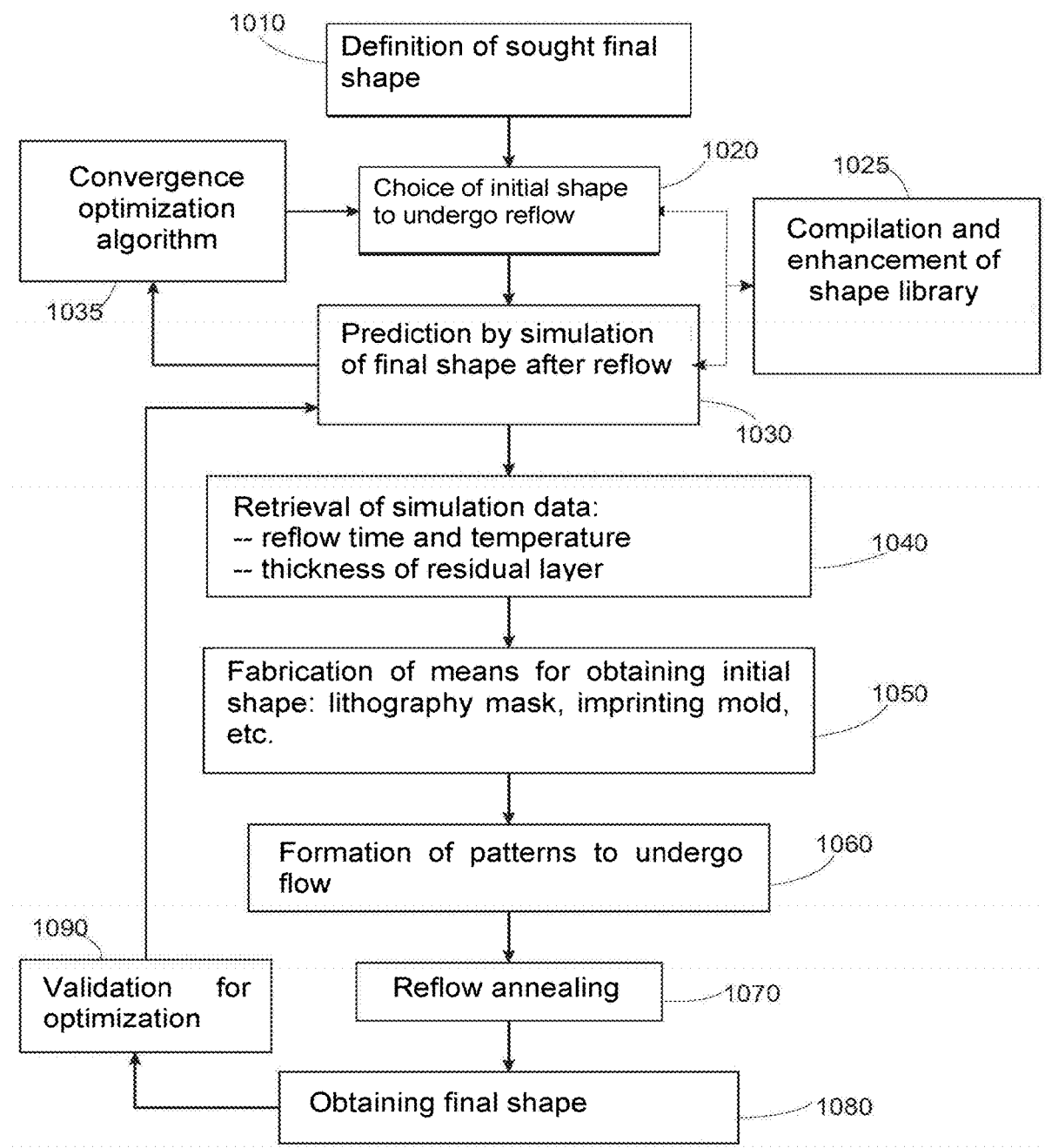
FIG. 10 illustrates the steps of an example of a method according to one embodiment of the invention and which are suitable for obtaining complex shapes by means of reflow.

FIG. 10 illustrates the steps of a method according to the invention suitable for obtaining possibly complex shapes by reflow. As shown in FIG. 11, obtaining the final shape 1010 of the patterns sought first of all involves the definition 1010 thereof according to the application in question. For example, in the case of a microlens array, it is known how to define very precisely the shape of the microlenses required for the application in question according to the focal length and the aperture sought.

The initial shape 1020 based on which the reflow operation is to be performed is then chosen. This choice is dependent on numerous parameters comprising the definition of the means with which the initial shape can be obtained, for example, using standard photolithography operations or using so-called grayscale photolithography or based on an imprinting mold. The choice will be made iteratively by predicting the final shape by simulation 1030 using a library of previously tested possible initial shapes 1025 and possibly using a convergence algorithm 1035 until a shape is obtained by simulation, otherwise absolutely identical, at least very similar to the final shape sought. The assessment of the proximity between the shape sought and the shape obtained may defined strictly, for example, using a coefficient of correlation between the two shapes and continuing the above iterations until the objective has been attained or exceeded.

The library of shapes 1025 may be enhanced with all the previous feedback. It should be noted herein that the simulation step is enabled by the presence of the residual layer.

When the final shape obtained is satisfactory, all the simulation data is retrieved 1040 including, inter alia, the reflow temperature and time and the residual thickness used to obtain the simulated final shape sought. This data will enable the effective implementation of the fabrication method according to the invention.

Moreover, according to the choice of the initial shape made for the simulation, the means for obtaining this initial shape are set up 1050. This step may comprise the fabrication of lithography masks or of an imprinting mold. It will not be necessary if the means for forming the initial patterns do not require a mask or mold which will be the case if these initial patterns are obtained by electron beam lithography for example.

The actual formation 1060 of the patterns to undergo reflow may then be performed. This embodiment step includes control of the thickness of the residual layer.

The reflow operation per se is then performed at a temperature and during a time defined by the simulation.

The results obtained are then validated 1090 with, possibly, corrective actions applied at the level of the iterative simulation loop 1020, 1025, 1030 and 1035.

Figure 11:
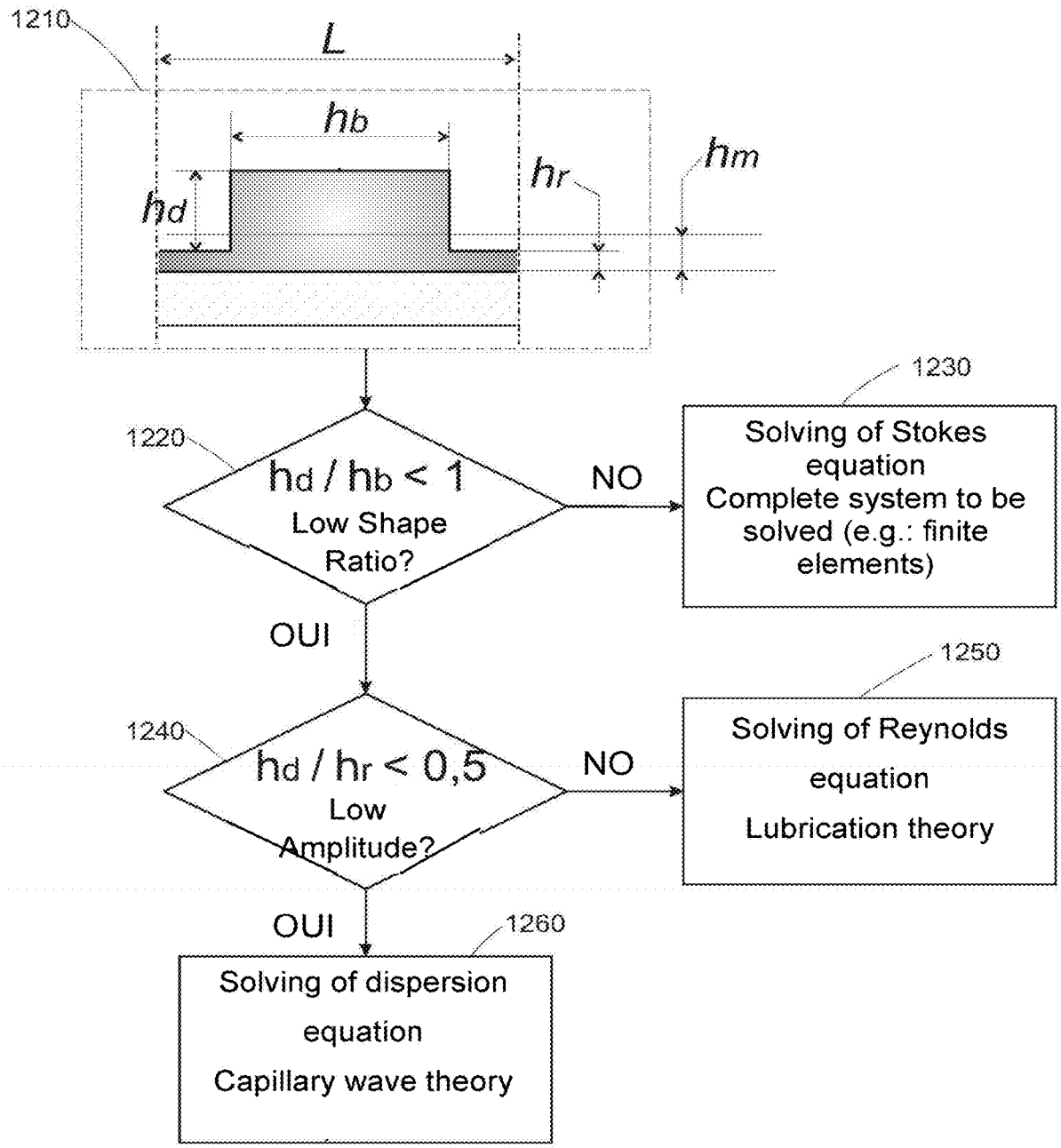
FIG. 11 describes the details of the simulation steps used according to the structure of the pattern to undergo reflow.

FIG. 11 describes the simulation steps according to the structure of the pattern to undergo reflow. As shown in the step 1210, the choice of the reflow model to be applied is made according to the geometry of the matter, notably by comparing the values of the mean residual thickness (hr), the mean pattern height (hd) and the horizontal extension (hb) of the pattern.

It is known that the motion of a fluid comparable to a continuous, homogeneous, incompressible medium, devoid of chemical reactions therein, and having an identical temperature at all points, is described by the following two equations:

$$\text{Conservation of mass: } \nabla \cdot v = 0. \quad (E1)$$

Navier-Stokes equation:

$$\rho\left(\frac{\partial v}{\partial t} + v \cdot \nabla v\right) = -\nabla p + \nabla \cdot T + f, \quad (E2)$$

where v represents the velocity field in the fluid, ρ the density of the fluid, t le temps, p the pressure field, T the viscous stress tensor and f the sum of the remote action forces. To these equations, it is necessary to add the limit conditions in the field of fluids, which are in our case:
Velocity different to zero (non-sliding) at fluid-substrate interface:

$$v(0)=0 \quad (E3)$$

Laplace pressure (surface tension) at fluid-air interface:

$$p_i - p_e = \gamma \times \kappa \quad (E4)$$

where pi and pe are the internal and external pressures, γ a physical parameter referred to as the surface tension, and κ the local curvature of the interface.

In the field of microfluidics, it is known that, due to length scale reduction, the Navier-Stokes equation is reduced to the Stokes equation:

$$\nabla p = \nabla \cdot T + f \quad (E5)$$

The scenarios discussed herein are devoid of remote action forces (no electrostatic force for example), such that the Stokes equation is reduced to:

$$\nabla p = \nabla \cdot T \quad (E6)$$

The final equation required, referred to as the closing equation, or behavioral law, correlates the viscous stress tensor with the flow kinematics, or with the flow history:

$$\nabla \cdot T = f(v, \dot{v}, \ldots) \quad (E7)$$

In the simple case of an incompressible Newtonian fluid, the behavioral law is written:

$$\nabla \cdot T = \eta \nabla^2 v \quad (E8)$$

where η is a physical parameter referred to the Newtonian viscosity.

The reflow simulation, i.e. the simulation of the topographic development of the patterns, consists of solving the motion of the free interface (fluid-air interface). This motion is determined by the flow of the fluid, and the simulation thereof requires the resolution of the system compiling the equations (E1), (E3), (E4), (E6) and (E7), referred to as the complete system.

We will now see that, subject to certain geometric conditions, the resolution of the flow may be approximated with simplified models. Let us take an elementary pattern for which the simulation of the reflow is sought, as represented in the diagram 1210. This pattern is characterized as can be seen by "hr" the mean residual thickness thereof, "hd" the mean height thereof, "hb" the extension thereof in a plane parallel with the face of the substrate receiving the horizontal layer along with the width "L" of the zone wherein it is inscribed. "L" denotes the width of the zone in question, i.e. the width of the zone comprising the pattern and the zone only containing the residual thickness. The width "L" is illustrated in FIG. 11.

The choice is firstly made in the step 1220 where the mean pattern height (hd) and the horizontal extension (hb) of the pattern are compared.

If the hd/hb ratio is not low, i.e. if it is not less than 1 then a first simulation model 1230 is used where the Stokes equation and the complete system are solved. Indeed, if the hd/hb shape ratio is moderate or high, i.e. in practice greater than 1, then there is no approximated model and the complete system needs to be solved. A finite element or finite volume computing code may be used, for example, using commercially available software such as: COMSOL, FLUENT and OPENFOAM. The computing time on an individual computer is of the order of a few minutes to several hours according to the size and complexity of the pattern.

On the other hand, if the shape ratio is low (in practice less than 1), the limit condition (E4) may be linearized:

$$p_i - p_e = \gamma \times \nabla^2 h \quad (E9)$$

where $\nabla^2 h$ is the Laplacian of the local thickness. Two models may then be used which correspond to the steps 1250 and 1260 in FIG. 11.

If the amplitude of the pattern is of the same order or greater than the residual thickness, i.e. it does not have a low amplitude 1240, then the lubrication theory 1250 may be applied. Typically, if hd/hr<0.5 then, the step 1250 is applied. This theory is widely used in the field of thin films [see A. Oron, S. H. Davis, and S. G. Bankoff. Reviews of Modern Physics 69, 931 (1997); R. V. Craster and O. K. Matar. Reviews of Modern Physics 81, 1131 (2009)]. The principle thereof is as follows: a first-order asymptotic development of the Stokes equations (E6) and the mass balance (E1) may be carried out by considering the shape ratio (hd/hb) as infinitely small. The main result is that the pressure gradient is horizontal, thus that the flow is essential parallel to the substrate. Specifically, we find that the local variation of thickness h is given by the Reynolds equation:

$$\frac{\partial h}{\partial t} = \nabla \cdot \left(\frac{h^3}{3\eta} \nabla(\gamma \times \nabla^2 h)\right) \quad (E10)$$

It should be noted herein that the fluid is considered to be a Newtonian fluid. This equation, though significantly nonlinear, contains therein the limit conditions and the entire flow kinematics. It only relates to the thickness of the film, i.e. the topography thereof, and thus we are spared the resolution of the velocity field within the fluid.

The Reynolds equation may be solved using a finite volume method [see Y. Ha, Y.-J. Kim and T. G. Myers. Journal of Computational Physics 227, 7246-7263 (2008)]. The computing time on an individual computer is of the order of a few seconds to several minutes according to the size and complexity of the pattern.

If the amplitude of the pattern is now largely less than the residual thickness, i.e. in practice less than half, a further theory may advantageously be used: the capillary wave theory 1260. The capillary wave theory is a physical model for describing the progression of a free liquid interface subjected to a small deformation. On a human scale, this is comparable to the ripples caused on the surface of a lake by the wind or by throwing a stone. This theory can be adapted to the reflow of a nanometric or micrometric pattern. If the deformations of the interface are small, then the pressure at the interface may be approximated by that in terms of the mean thickness (annotated Hm):

$$p(h) \approx p(Hm) \qquad (E11)$$

Considering FIG. 11, this gives Hm=hr+(hd*hb)/L.

The computation consists of breaking down the topography of the free surface into plane waves (capillary waves having a wave vector k), and studying the flow dynamics in the frequency domain (of frequency ω). The study in the frequency domain is not essential for a Newtonian fluid, but it makes it possible to account for viscoelastic fluids wherein the viscosity is dependent on the frequency (this viscosity, annotated η(ω), is generally referred to as complex viscosity). This method is used to convert the partial derivative equations (E1) and (E6) to algebraic equations. The details of the computations are not reported herein [see E. Rognin, S. Landis, and L. Davoust. Physical Review E 84, 041805 (2011)]. As is often the case in an undulatory theory, the result takes the form of a dispersion relation, i.e. a necessary condition correlating the frequency of the wave ω with the wave vector k thereof via the various physical and geometric parameters. This dispersion relation is expressed by:

$$\frac{j\omega\eta}{\aleph} = f(k \times Hm) \qquad (E12)$$

where i is the imaginary unit, k the wave vector standard, and f a dimensionless function of the standardized wave vector by the mean thickness Hm:

$$f(k \times Hm) = \frac{kHm \tanh kHm - \left(\frac{kHm}{\cosh kHm}\right)^2}{2 + 2\left(\frac{kHm}{\cosh kHm}\right)^2} \qquad (E13)$$

The difficulty of the problem now lies in solving the dispersion equation, i.e. expressing ω as an explicit function of k. This is performed merely in the case of a Newtonian fluid, i.e. when the viscosity is not dependent on the frequency. Indeed, we obtain that each capillary wave, i.e. each mode of the topography, decreases exponentially as:

$$\hat{h}(k, t) = \hat{h}(k, 0) \times \exp\left(-\frac{\aleph f(k \times Hm)}{\eta Hm} \times t\right) \qquad (E14)$$

where h (k, t) is the amplitude of the wave vector mode k at the time t.

Simulating the topographic progression of the film thus consists, in this case, of breaking down the topography into plane waves by a Fourier transform algorithm, using software such as for example MATLAB or OCTAVE, and applying to each mode the exponential multiplying coefficient of the equation (E14). The computing time on an individual computer is less than one second.

In the light of the description above, it is clear that the invention makes it possible to provide a reliable, simple and inexpensive solution for each of the following problems:
  determining the optimal reflow conditions for obtaining the final structure closest to the sought structure based on a given initial structure;
  determining the optimal structure for obtaining, after reflow under set temperature and time conditions, the structure closest to the geometric structure sought;
  determining both the initial structure and the optimal reflow conditions for obtaining the structure closest to the sought structure.

The invention thus makes it possible to accurately predict the progression over time of a shape subjected to reflow. It consequently makes it possible to considerably reduce the number of trials required with existing solutions particularly for obtaining complex structures.

The invention thus makes it possible to significantly reduce the cost for obtaining these structures.

It further emerges that the method according to the invention offers numerous additional advantages whereby:
  it makes it possible to produce 3D molds, the shape whereof would be difficult to produce otherwise. The shape obtained by annealing may be used as a polymer mold or be etched into a substrate to form the mold per se.
  it gives access to shapes simply by reducing the number of conventional lithography steps required for obtaining same;
  it gives access to a large number of geometries based on the same imprint or the same lithography;
  it enables the production of molds at wafer-scale, typically of 8 to 12 inches;
  enables the production of molds for injection for example electroplating of the annealed mold.

Moreover, the method according to the invention provides the field of aspherical microlens array production with a solution or significantly improves the following points:
  reducing the microlens beam spot and reduces the spherical aberrations thereof;
  increasing the numerical aperture of the microlenses;
  for a fixed lens diameter, the focal length may be chosen closest to the aspherical microlens, which is not the case of hemispherical or spherical microlenses;
  access to a greater number of microlens geometries based on an imprint;
  increasing the spatial density of the microlenses and filling rate;
  potential application to any applications requiring significant focal lengths and wide numerical apertures.

The invention is not limited to the embodiments described above and extends to all the embodiments covered by the claims.

In particular, the invention is not limited to the embodiment of microlenses and extends to the embodiment of all types of devices for electronic, micromechanical, electromechanical (MEMS, NEMS, etc.), optical or optoelectronic (MOEMS, etc.) purposes.

The invention claimed is:

1. A method for determining at least one reflow parameter for obtaining a structure approximating a sought structure reflowing an initial structure different to the sought structure, the initial structure including at least one pattern formed in a thermo-deformable layer arranged on a substrate, wherein the thermo-deformable layer forms a residual layer surrounding each pattern and from which each pattern extends such that each pattern has an interface only with the surrounding medium, the method comprising:
  predicting, by a computer, progression over time of geometry of the initial structure subject to reflow, to obtain a plurality of geometries of predicted structures each associated with reflow parameters comprising at least a reflow time and a reflow temperature;

computing, by the computer, correlation values of the geometry of each predicted structure with respect to the sought structure;

identifying, by the computer, reflow parameters for obtaining the predicted structure offering a highest correlation value, the identified reflow parameters being intended to be applied to a reflow of the initial structure; and reflowing the initial structure by applying the reflow parameters for obtaining the predicted structure offering the highest correlation value.

2. The method according to claim 1, wherein the residual layer covers the substrate entirely.

3. The method according to claim 1, wherein the residual layer surrounds each pattern such that all lines or edges along a contour of each pattern are only in contact with an ambient medium.

4. The method according to claim 1, wherein the initial structure includes triple points, in contact both with an ambient medium and the substrate supporting the layer of thermo-deformable material, the triple points being separated from each pattern by a distance at least equal to Dmini, wherein $D \min i = 2 \operatorname{Max}(hr, hd, \lambda)$, wherein hr=mean thickness of the residual layer between a pattern closest to the triple point and the triple point; wherein hd=height of the pattern closest to the triple point, and; wherein λ=the distance mutually separating the two patterns which are closest to the triple point.

5. The method according to claim 1, wherein besides the patterns, the residual layer has a thickness which does not vary by more than 10% with respect to the mean thickness of the thermo-deformable layer besides the patterns.

6. The method according to claim 1, wherein the predicting, computing correlation values, and identifying the reflow parameters are repeated with a plurality of initial structures wherein the geometries are different to one another.

7. The method according to claim 6, wherein among the plurality of initial structures, the initial structure to obtain a highest correlation value is identified.

8. The method according to claim 6, wherein the predicting, computing correlation values, and identifying the reflow parameters are repeated with a plurality of initial structures wherein the geometries are different to one another only if a highest correlation value for a given initial structure is less than a predetermined correlation threshold.

9. The method according to claim 1, wherein a maximum reflow temperature is set.

10. The method according to claim 1, wherein a maximum reflow time is set.

11. The method according to claim 1, wherein the predicting the progression over time of the geometry of the initial structure subject to reflow is dependent on the thickness of the residual layer.

12. The method according to claim 1, wherein the initial structure is formed at least in part by overlaid cubes or blocks.

13. The method according to claim 1, wherein the initial structure has a triangular cross-section along a section perpendicular to the plane wherein the substrate essentially extends.

14. The method according to claim 1, wherein the predicted structure offering the highest correlation value comprises one or a plurality of aspherical lenses or one or a plurality of Fresnel lenses.

15. The method according to claim 1, wherein the predicted structure offering the highest correlation value is a structure for a tool for fabricating a microelectronic device or a structure of a microelectronic device.

16. A method for obtaining at least one structure approximating a sought structure from at least one initial structure, different to the sought structure, the initial structure including at least one pattern formed in a thermo-deformable layer arranged on a substrate, wherein the thermo-deformable layer forms a residual layer surrounding each pattern and from which each pattern extends such that each pattern has an interface only with the surrounding medium, and the method comprising:

predicting, by a computer, progression over time of geometry of the initial structure subject to reflow, to obtain a plurality of predicted structures each associated with reflow parameters comprising at least a reflow time and a reflow temperature;

computing, by the computer, correlation values of the geometry of each predicted structure with respect to the sought structure;

identifying, by the computer, reflow parameters for obtaining the predicted structure offering a highest correlation value, the identified reflow parameters being supplied to a reflow apparatus; and reflowing the initial structure, the reflowing being performed by the reflow apparatus by applying the reflow parameters for obtaining the predicted structure offering the highest correlation value.

17. The method according to claim 16, wherein the predicting, computing correlation values, and identifying the reflow parameters are repeated with a plurality of initial structures wherein the geometries are different to one another and wherein, among the plurality of initial structures, an initial structure to obtain a highest correlation value is identified.

18. The method according to claim 17, wherein the reflow is performed based on the identified initial structure and the reflow parameters for attaining the highest correlation value for the identified initial structure.

19. The method according to claim 16, wherein the initial structure is obtained by imprinting the thermo-deformable layer using a mold.

20. The method according to claim 16, wherein the initial structure is obtained by grayscale photolithography.

21. The method for fabricating a mold for nanometric imprinting bearing a plurality of structures each approximating a sought structure and configured to penetrate into a deformable material configured to imprint in the material the plurality of structures, wherein each structure is obtained from at least one initial structure, different to the sought structure, the initial structure including at least one pattern formed in a thermo-deformable layer arranged on a substrate, wherein the thermo-deformable layer forms a residual layer surrounding each pattern and from which each pattern extends such that each pattern has an interface only with the surrounding medium, and wherein the method comprises the prediction, computation, identification, and reflow of the method according to claim 16.

* * * * *